United States Patent [19]

Lin

[11] Patent Number: 5,013,588
[45] Date of Patent: May 7, 1991

[54] CORROSION RESISTANT SILICON INORGANIC POLYMERIC COATINGS

[75] Inventor: Yeong C. Lin, San Diego, Calif.

[73] Assignee: Advanced Diversified Technology, Inc., San Diego, Calif.

[21] Appl. No.: 378,011

[22] Filed: Jul. 11, 1989

[51] Int. Cl.$^5$ ................................................ B05D 3/02
[52] U.S. Cl. .............................. 427/397.7; 427/419.2; 428/418; 428/446; 428/448; 428/450; 428/473.5
[58] Field of Search .................. 427/376.2, 387, 389.8, 427/393.5, 397.7, 402, 402.1, 419.2; 428/446, 448, 450, 428, 473.5

[56] References Cited

U.S. PATENT DOCUMENTS 4,535,026  8/1985  Yoldas et al. .................. 427/379 X
4,636,440  1/1987  Jada .............................. 427/387 X Primary Examiner—Lusignan
Attorney, Agent, or Firm—Kinney & Lange

[57] ABSTRACT

A method of imparting protective or decorative layer to a substrate includes coating said surface with a hydrolyzable solution of silicon alkoxide in an organic solvent. Next, the solvent is evaporated to yield a polymer film, and the film is cured to yield a uniform protective layer on the substrate surface. The present invention also includes the article produced by such a method.

18 Claims, No Drawings

CORROSION RESISTANT SILICON INORGANIC POLYMERIC COATINGS

BACKGROUND OF THE INVENTION

There is a great demand from various industries for better thin-film coatings to protect material surfaces from corrosive and abrasive agents. Although many types of thin-films are available, each suffers from certain undesirable defects that are largely contributed by the lack of durability and ineffectiveness of the coatings. The effectiveness of a protective coating depends on both the chemical and mechanical properties of the film; whereas, the durability of the coating is governed by the interfacial adhesion between the film and the substrate as well as the wearcorrosion resistivity of the film.

The methods commonly used to prepare thin-films are generally of either chemical or physical techniques. One of the most utilized chemical methods for the production of protective or decorative films is by electrolytic deposition which provides a means of depositing metal films from an ionic solution of metal onto a metallic substrate. Anodization, a particular kind of electrolysis, makes use of the aluminum surface as the anode which during electrolysis is being oxidized by reacting with water in the electrolyte to form a nonporous coating of hydrated aluminum oxide thereon. However, the utility of this process is limited to only a few metals and it has been widely used for the production of tantalum oxide and aluminum oxide barrier films. Also, the brittle nature of the thicker film makes them susceptible to corrosion fatigue which causes local stress cracking and eventual rupture of the films. Other chemical methods include various organic coatings and they are an economically attractive choice for corrosion protection since they are easily handled and applied. Unfortunately, the lifetime of organic coatings is short due to their permeability to corrosive gases.

Physical methods consist of thermal and electron beam evaporation, and sputter deposition. These methods can produce more pure and well defined films, but the application of these films often requires an expensive vacuum apparatus or a particle-free environment.

In recent years, much attention has been given to utilize organometallic compounds for thin-film deposition because practically any organometallic compounds can be synthesized from a wide variety of elements in the periodic table. In addition, the abundant choice of commercially available organometallic compounds and the establishment of many chemical reactions for them have generated much enthusiasm for the development of new coating materials and techniques to meet the increasing demands of an industrial society. However, none of the thin-film processes in use today is satisfactory; they all suffer from one or more drawbacks such as control difficulty, process complexity and substrate damage. The invention described herein provides a simple and low cost process for producing unique and high quality protective coatings that have overcome most, if not all, limitations of existing coatings.

SUMMARY OF THE INVENTION

The present invention includes a method for imparting a protective or decorative layer to a substrate. The method includes coating the substrate surface with a hydrolyzable solution of silicon alkoxide in an organic solvent. The solvent is evaporated to yield a polymer film, and the film is cured to yield a uniform protective layer on the substrate surface. The present invention also includes the article produced by such a method.

DETAILED DESCRIPTION OF THE PREFERRED EMBODIMENTS

The present invention is directed to a technique which is aimed to impart a protective thin-layer of a silicon inorganic polymeric substance onto the substrate's surface. The protective layer is formed by coextensively coating the surface with a hydrolyzable solution of silicon tetraethoxide, $Si(OEt)_4$, in a volatile organic solvent such as an alcohol. Upon evaporation of the solvent, a polymeric film of metallosiloxane is formed and it cures at higher temperatures to yield a uniform, protective layer.

Technique

Preparation of Coating Solution: Coating solutions to be employed in this invention are made by first developing silicon (C1-C6) alkoxides in a selected organic solvent. Cl to C6 alkyl alcohols are usually used as a solvent for silicon alkoxides. The C1 to C3 alkyl alcohols such as ethanol, n-propanol and isopropanol are highly preferred. Other volatile organic solvents such as tetrahydrofuran and ether, which can dissolve small amounts of water can also be used. In general, the higher the volatility of the solvent, the faster will be the drying and polymerization processes.

Acid hydrolysis catalysts such as mineral acids, (HCl— $HNO_3$) or Lewis acids are used to prepare the partially hydrolyzed solution. In general, the amount of catalyst needed is about 2 to 500 parts by weight per million parts by weight of the silicon alkoxide. The degree of hydrolysis (x) is primarily controlled by selecting the proper amount of water in the solution, that is, $$x = 1/(1-nw)$$

where $nw = N1/N$ and N is the moles of hydrolyzed silicon alkoxide and N1 is the mole of water introduced in the system. A range of about 0.5 to 4 moles of water per mole of $Si(OEt)_4$ has been tested with good results.

The Coating Procedures: The resultant clear solution from the foregoing described method is then applied to the substrate surface by any simple means, for example, by dipping, spraying, or spinning. Coating thickness can be controlled by the concentration or viscosity of the solution, or by the speed and angle of dipping. For example, a single dipping of the substrate followed by immediate solvent evaporation yields coating thickness of at least 200 Å and less than 8000 Å. Multiple dip coating can be used to achieve the desired thickness. The coating solution is usually applied at room temperature and in an atmospheric environment. However, elevated temperatures can be used. In addition, the substrate can be preheated before the application of the coating solution to facilitate the film drying process. Accordingly, this treatment has a significant advantage for commercial application.

Upon evaporation of the ethanol, a metallosiloxane polymer film forms which cures rapidly by heat treatment to yield a uniform, protective layer. During the coating process, an environment saturated with high ethanol vapor pressure minimizes non-uniform film formation.

Choice of Substrate: Although the invention has been exemplified by the coating of silicon substrate, there is essentially no limitation on the substrate surfaces themselves. A wide variety of inorganic substances can be coated by this method. Examples of suitable substrates include, but are not limited to: metals and alloys, natural and synthetic minerals, glasses and ceramics, conductors, semiconductors and superconductors, and organic substrates such as epoxide resins, oxidized polypropylene, polyimide and the like. For example, the substrate surface can comprise Silicon or Aluminum, Sapphire ($Al_2O_3$), AC2 ($TiC-Al_2O_3$ composite), and the substrate surface can include —OH or —NHz.

The Interfacial Reaction: This invention has achieved a specific advantageous interfacial reaction by the formation of Si—O—S bonds between the coated material (—O—Si—O—) and the substrate surface (S), as shown below. During the coating process, condensation of Si—OR and S—OH bonds (which are present on most substrate surfaces) occurs, thus introducing a durable and chemically bonded interfacial adhesion.

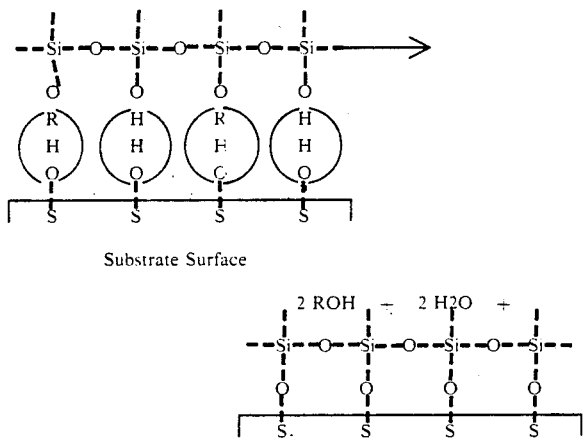

Substrate Surface

Although almost all substrates have a monolayer of hydroxide on their surfaces, the interaction of the metallosiloxane does not require the absolute presence of the hydroxide group. For example, the coated film can form a condensation product with an amino group. Nevertheless, the mere presence of a monolayer of either amino or hydroxide group on a substrate is sufficient to ensure coherence and adherence. Another added advantage of this invention is that, unlike anodization, the present thin-film adhesive property is not dependent on the geometry of the substrate.

Other Specific Properties: Another distinct feature of this invention is that the substrate surface roughness can be substantially reduced to less than 50 Å by this method. Such extremely smooth surfaces minimize wear which can ultimately lead to exposure of the corrosion-susceptible surface. In contrast, thin-films produced by chemical vapor deposition or by anodization are relatively ineffective in leveling surface defects.

Although the present invention has been described with reference to preferred embodiments, workers skilled in the art will recognize that changes may be made in form and detail without departing from the spirit and scope of the invention.

What is claimed is:

1. A method of imparting a protective or a decorative layer to a substrate; said method comprising:
    (a) coating said surface with a hydrolyzable solution of silicon alkoxide having a pH range of 1-3 in an organic solvent and having been hydrolyzed with a minimal effective amount of water;
    (b) evaporating said solvent to yield a polymer film; and
    (c) curing said film to yield a uniform protective layer on said substrate surface.

2. The method of claim 1 wherein said substrate surface comprises Silicon or Aluminum.

3. The method of claim 1 wherein said substrate surface comprises Sapphire ($Al_2O_3$).

4. The method of claim 1 wherein said substrate surface comprises AC-2 ($TiC-Al_2O_3$ composite).

5. The method of claim 1 wherein said substrate surface comprises a polyimide or glass.

6. The method of claim 1 wherein said substrate surface includes —OH or —$NH_2$ groups.

7. The method of claim 1 where said Silicon alkoxide comprises $Si(OEt)_4$; and the organic solvent comprises ethanol or isopropanol.

8. The method of claim 7 wherein the $Si(OEt)_4$ has been hydrolyzed by addition to said solution of about 0.5 to 4 moles of water per moles of $Si(OEt)_4$.

9. The method of claim 8 wherein said solution of partially hydrolyzed metal alkoxide comprises an acid as a catalyst and is prepared by heating said solution up to 76° C. for a time sufficient to facilitate the hydrolyzable polymer solution formation.

10. The method of claim 9 wherein the pH range of 1-3 of said solution of hydrolyzed metal alkoxide is provided by the addition of $HNO_3$ or HCl.

11. The method of claim 9 wherein the solution is applied to the substrate by dipping, spraying, or spinning.

12. The method of claim 10 wherein the substrate is made from a metal, an alloy, a semiconductor, a ceramic, a glass, an inorganic material, or an organic material.

13. The method of claim 1 wherein said film is cured by heat treatment.

14. The method of claim 1 wherein said film is at least about 200 Å thick.

15. The method of claim 1 wherein an inorganic barrier coating is applied to said film.

16. A coated article produced by the method of claim 1.

17. A coated article produced by the method of claim 14.

18. A coated article produced by the method of claim 15.

* * * * *